(12) United States Patent
Ulavi et al.

(10) Patent No.: US 11,623,253 B2
(45) Date of Patent: Apr. 11, 2023

(54) IN-SITU DC PLASMA FOR CLEANING PEDESTAL HEATER

(71) Applicant: Applied Materials, Inc., Santa Clara, CA (US)

(72) Inventors: Tejas Ulavi, San Jose, CA (US); Arkaprava Dan, San Jose, CA (US); Sanjeev Baluja, Campbell, CA (US); Wei V. Tang, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 17/582,100

(22) Filed: Jan. 24, 2022

(65) Prior Publication Data

US 2022/0152668 A1  May 19, 2022

Related U.S. Application Data

(62) Division of application No. 17/024,955, filed on Sep. 18, 2020, now Pat. No. 11,260,432.

(60) Provisional application No. 62/902,900, filed on Sep. 19, 2019.

(51) Int. Cl.
*B08B 7/00* (2006.01)

(52) U.S. Cl.
CPC ................. *B08B 7/0035* (2013.01)

(58) Field of Classification Search
CPC .................................................. B08B 7/0035
See application file for complete search history.

(56) References Cited

U.S. PATENT DOCUMENTS

| 6,992,876 | B1 | 1/2006 | Nakajima et al. |
| 2004/0233609 | A1* | 11/2004 | Yoshida .............. H01L 21/6833 |
| | | | 361/234 |
| 2005/0213279 | A1 | 9/2005 | Hayakawa |
| 2011/0209725 | A1 | 9/2011 | Kim et al. |
| 2012/0000606 | A1 | 1/2012 | Dorai et al. |
| 2019/0244787 | A1 | 8/2019 | Chou et al. |

FOREIGN PATENT DOCUMENTS

| EP | 0871975 B1 | 8/2003 |
| WO | 2019060029 A1 | 3/2019 |

OTHER PUBLICATIONS

PCT International Search Report and Written Opinion in PCT/US2020/051511 dated Jan. 4, 2021, 9 pages.

* cited by examiner

*Primary Examiner* — Erin F Bergner
(74) *Attorney, Agent, or Firm* — Servilla Whitney LLC

(57) ABSTRACT

Substrate supports, substrate support assemblies and methods of using an arc generated between a first electrode and a second electrode to clean a support surface. The first electrode comprises a plurality of first branches which are interdigitated with a plurality of branches of the second electrode in a finger-joint like pattern creating a gap between the first electrode and the second electrode.

17 Claims, 10 Drawing Sheets

IN-SITU DC PLASMA FOR CLEANING PEDESTAL HEATER

CROSS-REFERENCE TO RELATED APPLICATIONS

This application is a divisional application of U.S. application Ser. No. 17/024,955, filed Sep. 18, 2020, which claims priority to U.S. Provisional Application No. 62/902,900, filed Sep. 19, 2019, the entire disclosure of which is hereby incorporated by reference herein.

TECHNICAL FIELD

Embodiments of the present disclosure generally relate to apparatus and methods for processing substrates. In particular, embodiments of the disclosure are directed to apparatus and methods for cleaning a substrate support by generating plasma between a gap between a first electrode and second electrode of an electrostatic chuck.

BACKGROUND

Many deposition processes benefit from maintaining a uniform and small gap between the surface of the gas distribution plate and the substrate. For example, atomic layer deposition processes (ALD) often have a very small substrate to gas injector spacing. Variations in this gap can cause changes in the flow uniformity of gases across the substrate surface. The gap variations are even more prominent when the substrate is moved between processing stations. Multiple deposition processing cycles may result in non-uniformity and flatness variation of the substrate support surface, also referred to as the pedestal surface. Changes in the flatness of the substrate support increase variations in the reaction space between the gas injector and the substrate.

Cleaning substrate support surfaces after multiple cycles improves uniformity and flatness. However, such procedures result in maintenance and down time of the processing chamber. Current maintenance procedures may further involve expensive ancillary systems such as remote plasma sources (RPS) as cleaning systems. RPS systems create radicals which travel through long paths within the processing chamber, affecting the cleaning efficiency of the system. The radicals created may also corrode or adversely affect the surface of aluminum showerheads or gas lines that the radicals are exposed to during the cleaning process.

Therefore, there is a need in the art for apparatus and methods to clean the substrate support surface using existing components within the processing chamber.

SUMMARY

One or more embodiments of the disclosure are directed to substrate supports having an electrostatic chuck. A first electrode has a middle hub with a first trunk extending in a first direction from the middle hub to an outer peripheral end. A second electrode extends in a second direction opposite the first direction from an inner end adjacent to and spaced from the middle hub to an outer peripheral end. A plurality of first branches cross the first trunk. Each of the first branches is located at a first trunk distance from the middle hub and spaced from adjacent first branches. Each of the first branches has a first leg extending from a trunk end at the first trunk to a branch end in an arcuate path in a first direction around the middle hub with a radius equal to the first trunk distance, and a second leg extending from a trunk end at the first trunk to a branch end in an arcuate path in a second direction opposite the first direction around the middle hub with a radius equal to the first trunk distance. A plurality of second branches cross the second trunk. Each of the second branches is located a second trunk distance from the middle hub and spaced from adjacent second branches. Each of the second branches has a first leg extending from a trunk end at the second trunk to a branch end in an arcuate path in a first direction around the middle hub with a radius equal to the second trunk distance, and a second leg extending from a trunk end at the second trunk to a branch end in an arcuate path in a second direction around the middle hub with a radius equal to the second trunk distance, the plurality of second branches inter-digitated with and spaced from the plurality of first branches by a gap.

Additional embodiments of the disclosure are directed to methods of cleaning a substrate support. A plasma is generated between a first electrode having a first plurality of branches and second electrode having a second plurality of branches. The first electrode has a middle hub with a first trunk extending in a first direction from the middle hub to an outer peripheral end. The second electrode extends in a second direction opposite the first direction from an inner end adjacent to and spaced from the middle hub to an outer peripheral end. A plurality of first branches cross the first trunk. Each of the first branches is located at a first trunk distance from the middle hub and spaced from adjacent first branches. Each of the first branches has a first leg extending from a trunk end at the first trunk to a branch end in an arcuate path in a first direction around the middle hub with a radius equal to the first trunk distance, and a second leg extending from a trunk end at the first trunk to a branch end in an arcuate path in a second direction opposite the first direction around the middle hub with a radius equal to the first trunk distance. A plurality of second branches cross the second trunk. Each of the second branches is located a second trunk distance from the middle hub and spaced from adjacent second branches. Each of the second branches has a first leg extending from a trunk end at the second trunk to a branch end in an arcuate path in a first direction around the middle hub with a radius equal to the second trunk distance, and a second leg extending from a trunk end at the second trunk to a branch end in an arcuate path in a second direction around the middle hub with a radius equal to the second trunk distance, the plurality of second branches inter-digitated with and spaced from the plurality of first branches by a gap. The gap is configured to generate plasma between the first electrode and the second electrode and clean the support surface.

Further embodiments of the disclosure are directed to methods of cleaning a substrate support. A substrate is lifted on a plurality of lift pins through a plurality of lift pin openings by a height. A plasma is generated between a first electrode having a first plurality of branches and second electrode having a second plurality of branches. The first electrode has a middle hub with a first trunk extending in a first direction from the middle hub to an outer peripheral end. The second electrode extends in a second direction opposite the first direction from an inner end adjacent to and spaced from the middle hub to an outer peripheral end. A plurality of first branches cross the first trunk. Each of the first branches is located at a first trunk distance from the middle hub and spaced from adjacent first branches. Each of the first branches has a first leg extending from a trunk end at the first trunk to a branch end in an arcuate path in a first direction around the middle hub with a radius equal to the first trunk distance, and a second leg extending from a trunk end at the first trunk to a branch end in an arcuate path in a second direction opposite the first direction around the middle hub with a radius equal to the first trunk distance. A plurality of second branches cross the second trunk. Each of the second branches is located a second trunk distance from the middle hub and spaced from adjacent second branches. Each of the second branches has a first leg extending from a trunk end at the second trunk to a branch end in an arcuate path in a first direction around the middle hub with a radius equal to the second trunk distance, and a second leg extending from a trunk end at the second trunk to a branch end in an arcuate path in a second direction around the middle hub with a radius equal to the second trunk distance, the plurality of second branches inter-digitated with and spaced from the plurality of first branches by a gap. The gap is configured to generate plasma between the first electrode and the second electrode and clean the support surface. The height of the bottom surface of the substrate to the substrate support surface is configured to clean a bottom surface of the substrate upon generation of plasma without damaging the substrate.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Figure 1:
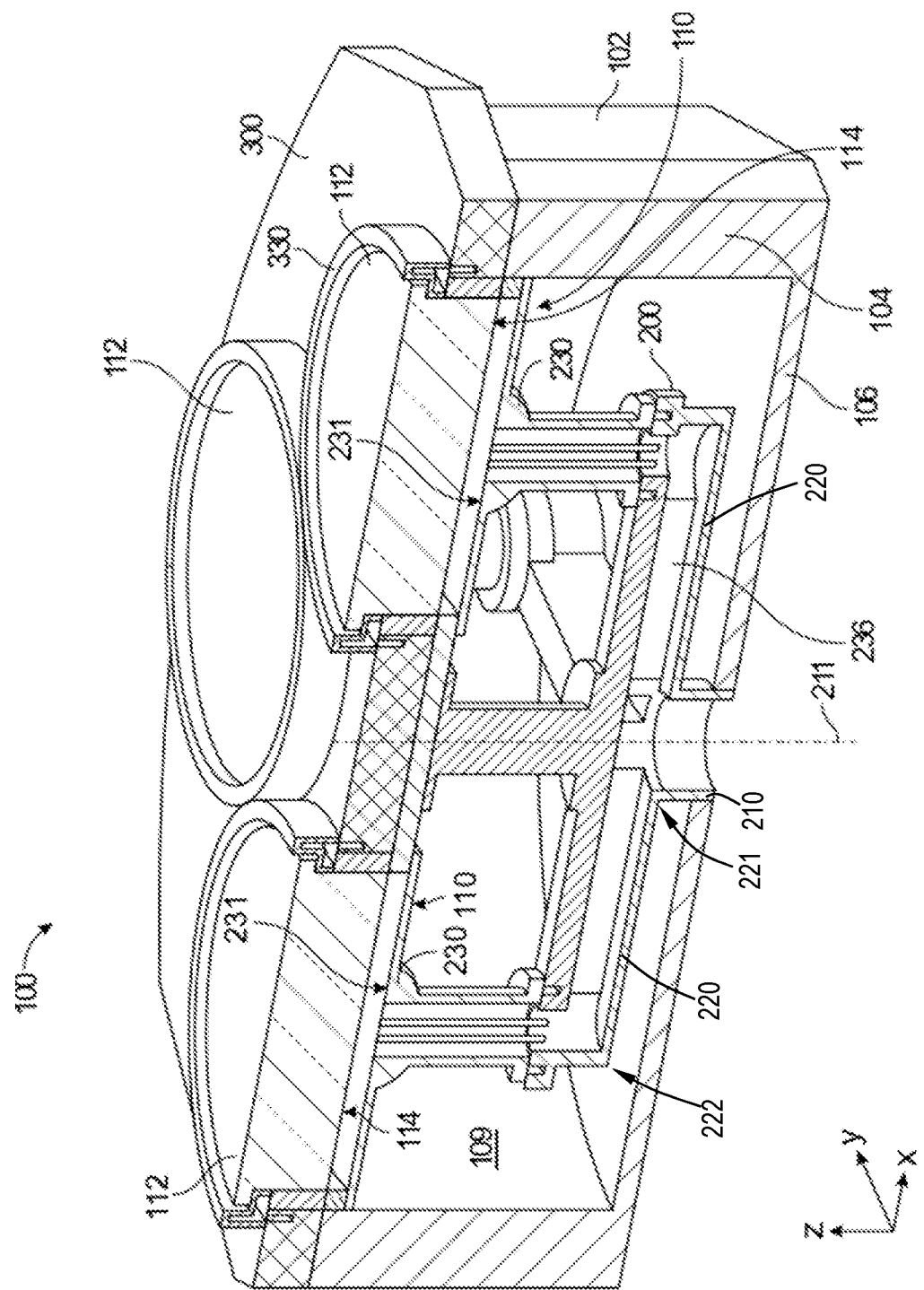
FIG. 1 shows a cross-sectional isometric view of a processing chamber in accordance with one or more embodiment of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor substrates. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface, or with a film formed on the substrate surface.

Embodiments of the disclosure are directed to apparatus and methods for generating an in-situ plasma on the pedestal surface. Some embodiments provide controllable and/or uniform DC plasma on the pedestal surface. Embodiments of the disclosure are advantageously usable with, for example, periodic pedestal surface cleaning, seasoning the pedestal heater surface after cleaning; treating the surface of the pedestal and cleaning the wafer backside or bevel.

One or more embodiments of the disclosure advantageously eliminate the need for a remote plasma source (RPS) for pedestal cleaning. Some embodiments improve cleaning efficiency by removing the RPS. Some embodiments decrease costs due to eliminating the need for one or more remote plasma sources.

For atomic layer deposition (ALD) application, deposition may occur on the pedestal surface because both reactive gases are exposed to the surface and the surface is maintained at a sufficiently elevated temperature for activation. One or more embodiments of the disclosure advantageously provide apparatus to selectively cleaning the pedestal surface.

Some embodiments allow for the seasoning or surface treatment of the substrate contact area of the pedestal. In some embodiments, a direct current (DC) plasma is generated with a substrate elevated above the pedestal on lift pins to clean the backside or bevel of the substrate. In some embodiments, the backside cleaning is incorporated into the substrate transfer out routine.

Figure 2:
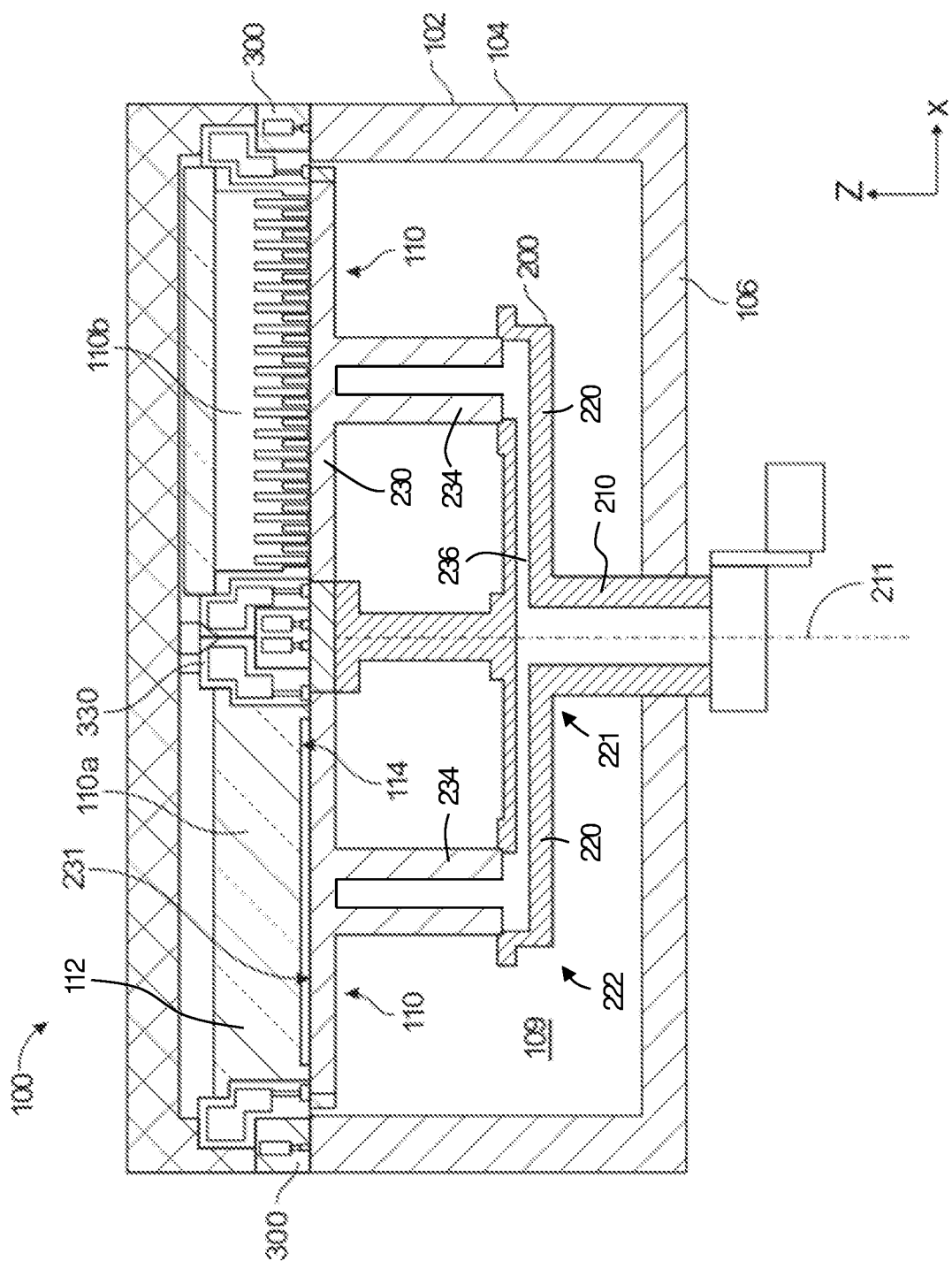
FIG. 2 shows a cross-sectional view of a processing chamber in accordance with one or more embodiment of the disclosure.

Embodiments of the disclosure are directed to substrate supports (also referred to as pedestals) for use with single substrate or multi-substrate (also referred to as batch) process chambers. FIGS. 1 and 2 illustrate a batch processing chamber 100 in accordance with one or more embodiment of the disclosure. FIG. 1 shows the processing chamber 100 illustrated as a cross-sectional isometric view in accordance with one or more embodiment of the disclosure. FIG. 2 shows a processing chamber 100 in cross-section according to one or more embodiment of the disclosure.

The processing chamber 100 has a housing 102 with walls 104 and a bottom 106. The housing 102 along with the top plate 300 define a interior volume 109, also referred to as a processing volume.

The processing chamber 100 illustrated includes a plurality of processing stations 110. The processing stations 110 are located in the interior volume 109 of the housing 102 and are positioned in a circular arrangement around the rotational axis 211 of the support assembly 200. Each processing station 110 comprises a gas injector 112 (also referred to as a gas distribution plate) having a front surface 114. The processing stations 110 are defined as a region in which processing can occur. For example, in some embodiments, a processing station 110 is defined as a region bounded by the support surface 231 of the support assembly 200, as described below, and the front surface 114 of the gas injectors 112. In the illustrated embodiment, heaters 230 act as the substrate support surfaces and form part of the support assembly 200.

The processing stations 110 can be configured to perform any suitable process and provide any suitable process conditions. The type of gas injector 112 used will depend on, for example, the type of process being performed and the type of showerhead or gas injector. For example, a processing station 110 configured to operate as an atomic layer deposition apparatus may have a showerhead or vortex type gas injector. Whereas, a processing station 110 configured to operate as a plasma station may have one or more electrode and/or grounded plate configuration to generate a plasma while allowing a plasma gas to flow toward the substrate. The embodiment illustrated in FIG. 2 has a different type of processing station 110 on the left side (processing station 110a) of the drawing than on the right side (processing station 110b) of the drawing. Suitable processing stations 110 include, but are not limited to, thermal processing stations, microwave plasma, three-electrode CCP, ICP, parallel plate CCP, UV exposure, laser processing, pumping chambers, annealing stations and metrology stations.

Figure 3:
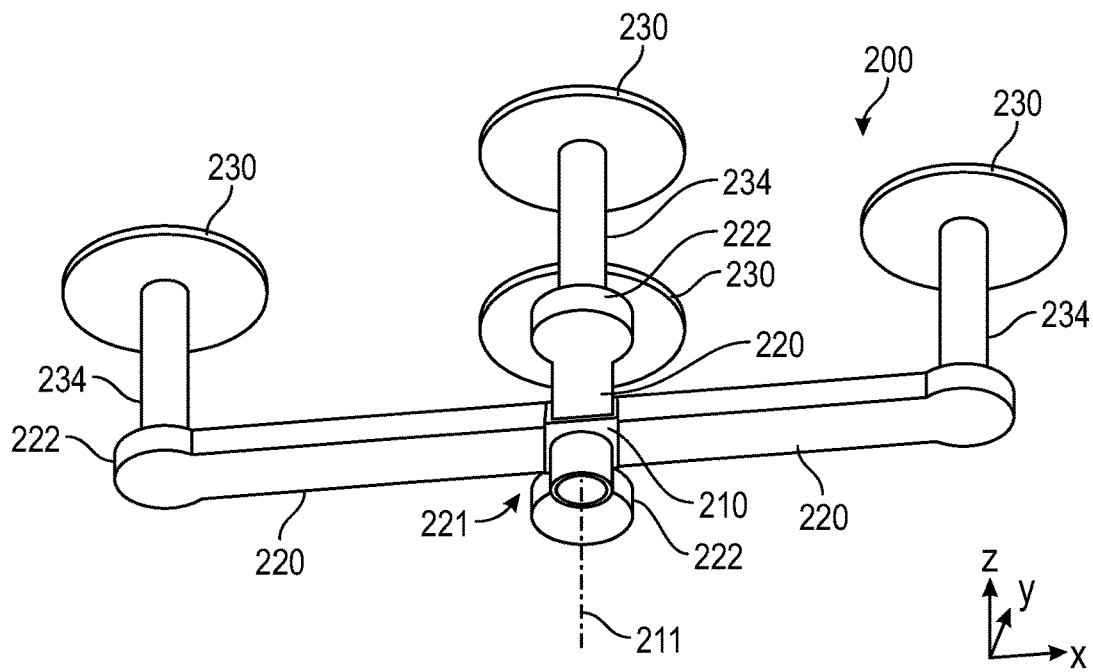
FIG. 3 is a bottom isometric view of a support assembly in accordance with one or more embodiment of the disclosure.
Figure 4:
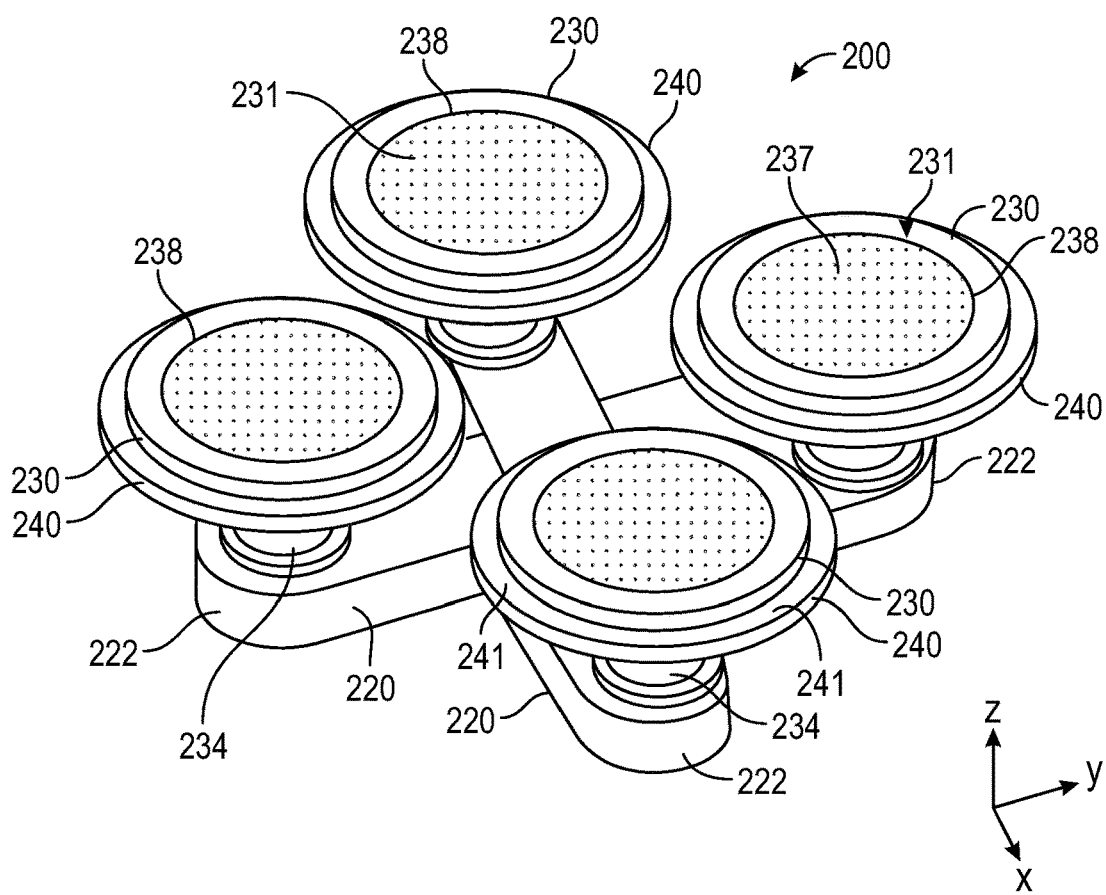
FIG. 4 is a top isometric view of a support assembly in accordance with one or more embodiment of the disclosure.
Figure 5:
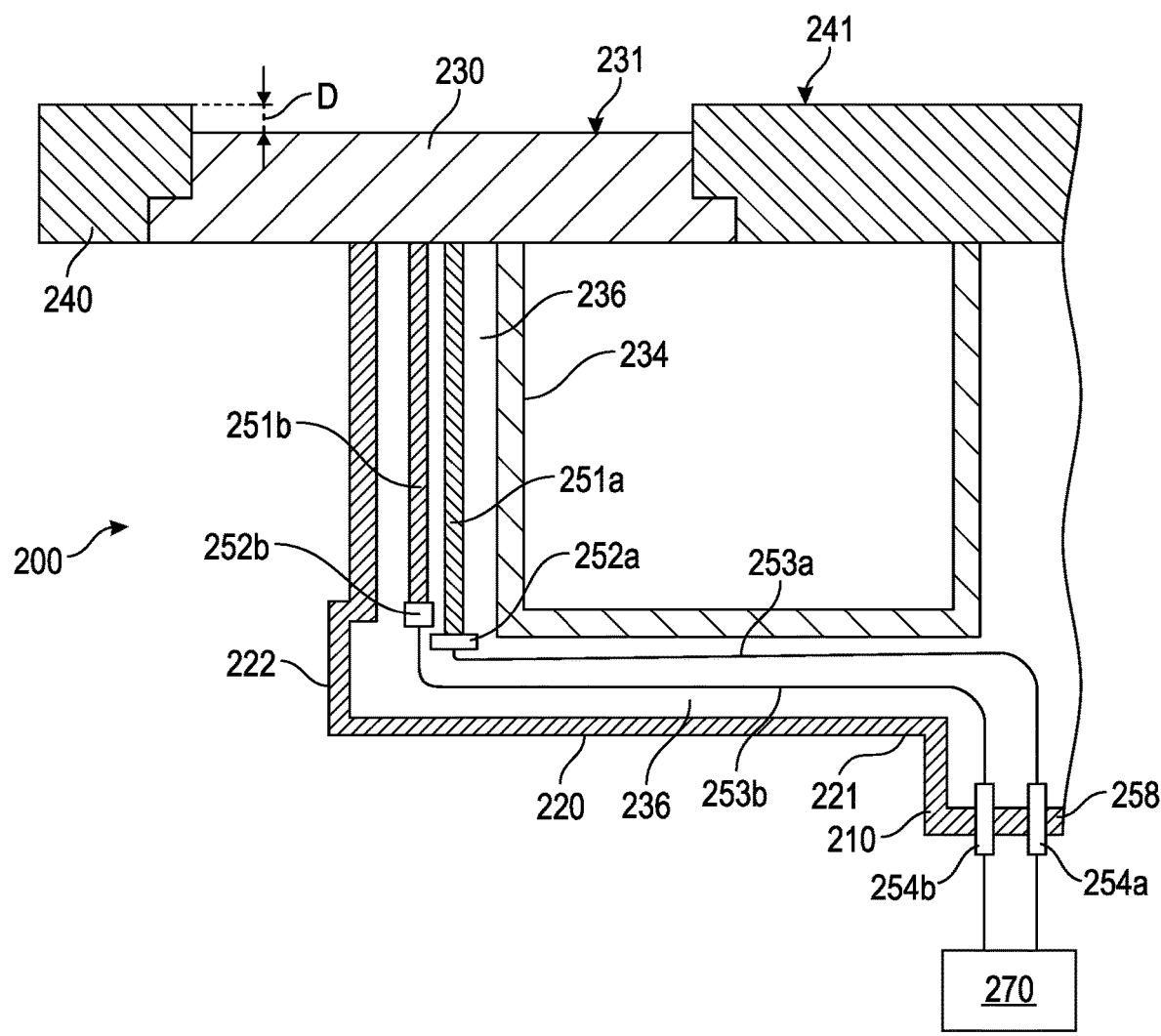
FIG. 5 is a partial cross-sectional schematic view of a support assembly in accordance with one or more embodiment of the disclosure.

FIGS. 3 through 5 illustrate support assemblies 200 in accordance with one or more embodiments of the disclosure. With reference to FIGS. 1-5, support assembly 200 includes a rotatable center base 210. The rotatable center base 210 can have a symmetrical or asymmetrical shape and defines a rotational axis 211. The rotational axis 211, as can be seen in FIGS. 1 through 3, extends in a first direction. The first direction may be referred to as the vertical direction or along the z-axis. The use of the term "vertical" is not limited to a direction parallel to the pull of gravity, and the use of the term "horizontal" is not limited to a direction normal to the pull of gravity.

The support assembly 200 includes at least two support arms 220 connected to and extending from the center base 210. The support arms 220 have an inner end 221 and an outer end 222. The inner end 221 is in contact with the center base 210 so that when the center base 210 rotates around the rotational axis 211, the support arms 220 rotate as well. In some embodiments, the support arms 220 extend orthogonal to the rotational axis 211 so that the outer ends 222 are further from the rotational axis 211 than the inner ends 221 of the same support arm 220.

The support arms 220 can be connected to the center base 210 by any suitable manner known to the skilled artisan. For example, in some embodiments, the inner end 221 is connected to the center base 210 by use of fasteners (e.g., bolts). In some embodiments, the inner end 221 is integrally formed with the center base 210.

The number of support arms 220 in the support assembly 200 can vary. In some embodiments, there are at least two support arms 220, at least three support arms 220, at least four support arms 220, or at least five support arms 220. In some embodiments, there are three support arms 220. In some embodiments, there are four support arms 220. In some embodiments, there are five support arms 220. In some embodiments, there are six support arms 220.

The support arms 220 of some embodiments are arranged symmetrically around the center base 210. For example, in a support assembly 200 with four support arms 220, each of the support arms 220 are positioned at 90° intervals around the center base 210 so that an axis formed by the support arms 220 are perpendicular to an axis formed by an adjacent (not across the rotation axis 211) support arm 220. Stated differently, in embodiments with four support arms 220, the support arms are arrange to provide four-fold symmetry around the rotation axis 211. In a support assembly 200 with three support arms 220, the support arms 220 are positioned at 120° intervals around the center base 210 so that an axis formed by the support arms 220 are at a 120° angle to the other support arms 220. In some embodiments, the support assembly 200 has n-number of support arms 220 and the n-number of support arms 220 are arranged to provide n-fold symmetry around the rotation axis 211.

A heater 230 is positioned at the outer end 222 of the support arms 220. In some embodiments, each support arm 220 has a heater 230. The center of the heaters 230 are located at a distance from the rotational axis 211 so that upon rotation of the center base 210 around rotation axis 211, the heaters 230 move in a circular path around rotation axis 211.

The heaters 230 have a support surface 231 configured to support a substrate or wafer. In some embodiments, the heater 230 support surfaces 231 are substantially coplanar. As used in this manner, "substantially coplanar" means that the planes formed by the individual support surfaces 231 are within ±5°, ±4°, ±3°, ±2° or ±1° of the planes formed by the other support surfaces 231.

In some embodiments, the heaters 230 are positioned directly on the outer end 222 of the support arms 220. In some embodiments, as illustrated in the drawings, the heaters 230 are elevated above the outer end 222 of the support arms 220 by a heater standoff 234. The heater standoffs 234 can be any size and length to increase the height of the heaters 230. The term "pedestal" is used to refer to a heater standoff 234 with a support surface 231 connected to the top end of the standoff. The support surface 231 can be part of the heater 230 or part of a different component without a heating element.

In some embodiments, a channel 236 is formed in one or more of the center base 210, the support arms 220 and/or the heater standoffs 234. The channel 236 can be used to route electrical connections for the heaters 230, electrical connections for an electrostatic chuck or to provide a gas flow.

The heaters 230 can be any suitable type of heater known to the skilled artisan. In some embodiments, the heater 230 is a resistive heater with one or more heating elements within a heater body.

The heaters 230 of some embodiments include additional components. For example, the heaters may comprise an electrostatic chuck. The electrostatic chuck can include various wires and electrodes so that a wafer positioned on the heater support surface 231 can be held in place while the heater is moved. This allows a wafer to be chucked onto a heater at the beginning of a process and remain in that same position on that same heater while moving to different process regions. In some embodiments, the wires and electrodes are routed through the channels 236 in the support arms 220. FIG. 5 shows an expanded view of a portion of a support assembly 200 in which the channel 236 is shown. The channel 236 extends along the support arm 220 and the heater standoff 234. A first electrode 251a and second electrode 251b are in electrical communication with heater 230, or with a component inside heater 230 (e.g., a resistive wire or an electrostatic chuck). In the illustrated embodiment, a first wire 253a connects to first electrode 251a at first connector 252a; and a second wire 253b connects to second electrode 251b at second connector 252b. In some embodiments, there are more than two wires. For example, in an example embodiment with a heating element and an electrostatic chuck, at least two wires are in contact with the heating element and at least two wires are in contact with the electrostatic chuck.

In some embodiments, a temperature measuring device (e.g., pyrometer, thermistor, thermocouple) is positioned within the channel 236 to measure one or more of the heater 230 temperature or the temperature of a substrate on the heater 230. In some embodiments, the control and/or measurement wires for the temperature measurement device are routed through the channel 236. In some embodiments, one or more temperature measurement devices are positioned within the processing chamber 100 to measure the temperature of the heaters 230 and/or a wafer on the heaters 230. Suitable temperature measurement devices are known to the skilled artisan and include, but are not limited to, optical pyrometers and contact thermocouples.

The wires can be routed through the support arms 220 and the support assembly 200 to connect with a power source (not shown). In some embodiments, the connection to the power source allows continuous rotation of the support assembly 200 without tangling or breaking the wires 253a, 253b. In some embodiments, as shown in FIG. 5, the first wire 253a and second wire 253b extend along the channel 236 of the support arm 220 to the center base 210. In the center base 210 the first wire 253a connects with center first connector 254a and the second wire 253b connects with center second connector 254b. The center connectors 254a, 254b can be part of a connection plate 258 so that power or electronic signals can pass through center connectors 254a, 254b. In the illustrated embodiment, the support assembly 200 can rotate continuously without twisting or breaking wires because the wires terminate in the center base 210. In some embodiments, the support assembly 200 is configured to allow rotation up to about 360° without twisting or breaking wires. A second connection is on the opposite side of the connection plate 258 (outside of the processing chamber).

In some embodiments, the wires are connected directly or indirectly to a power supply 270 or electrical component outside of the processing chamber through the channel 236. In embodiments of this sort, the wires have sufficient slack to allow the support assembly 200 to be rotated a limited amount without twisting or breaking the wires. In some embodiments, the support assembly 200 is rotated less than or equal to about 1080°, 990°, 720°, 630°, 360° or 270° before the direction of rotation is reversed. This allows the heaters 230 to be rotated through each of the stations 110 without breaking the wires.

Referring to FIG. 4, the heater 230 and support surface 231 can include one or more gas outlets (or openings 237) to provide a flow of backside gas. The backside gas may assist in the removal of the wafer from the support surface 231 or allow for other processes to occur, as described below. As shown in FIG. 4, the support surface 231 includes a plurality of openings 237 and a gas channel 238. The openings 237 and/or gas channel 238 can be in fluid communication with one or more of a vacuum source or a gas source (e.g., a purge gas or reactive gas). In embodiments of this sort, a gas line can be included to allow fluid communication of a gas source with the openings 237 and/or gas channel 238.

Figure 6:
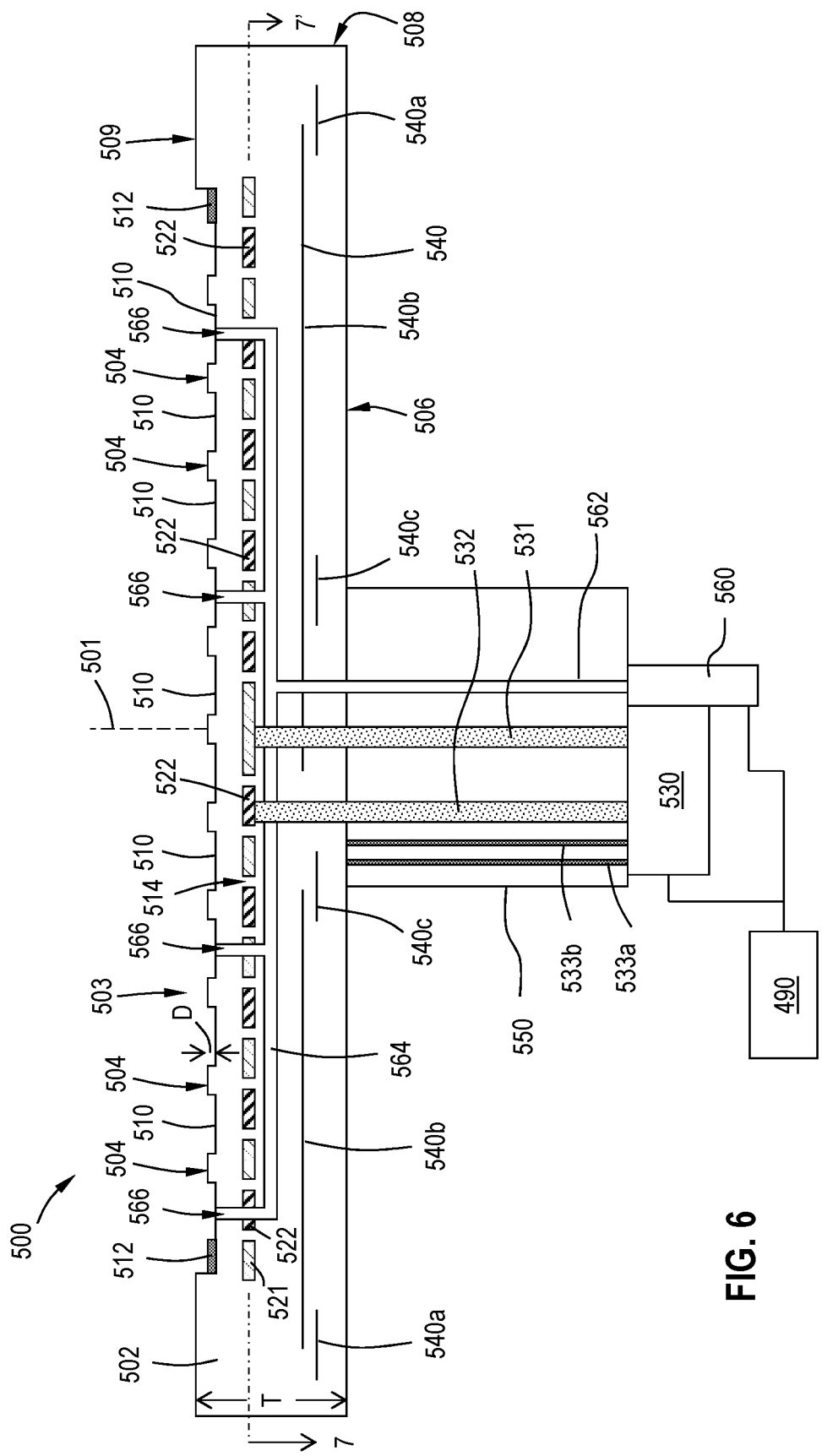
FIG. 6 is a cross-sectional schematic view of a substrate support according to one or more embodiment of the disclosure.
Figure 7:
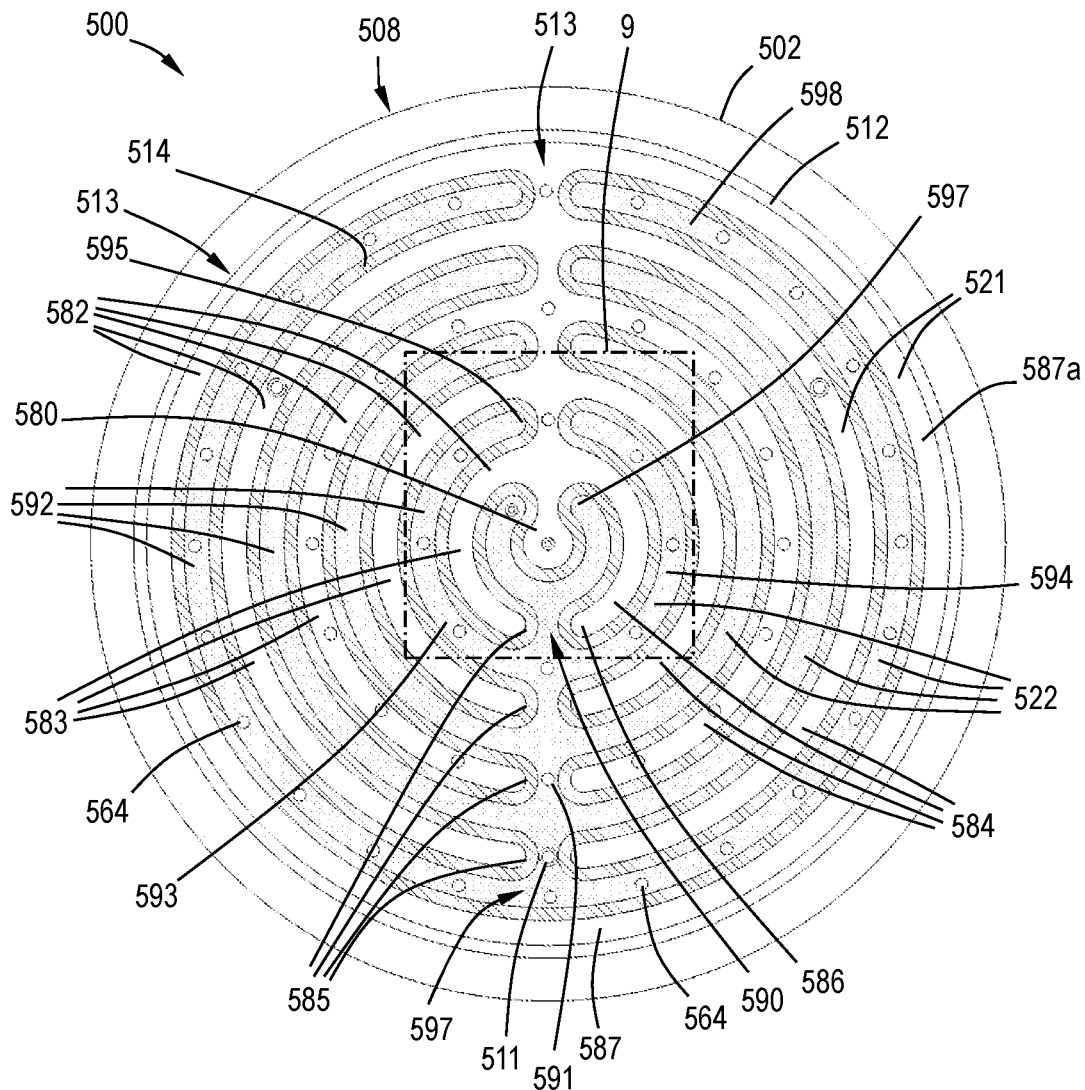
FIG. 7 is a cross-sectional schematic view of an electrostatic chuck taken along line 7-7' in FIG. 6; and, FIG. 8 is a cross-sectional schematic view of an electrostatic chuck taken along line 7-7' in FIG. 6.
Figure 8:
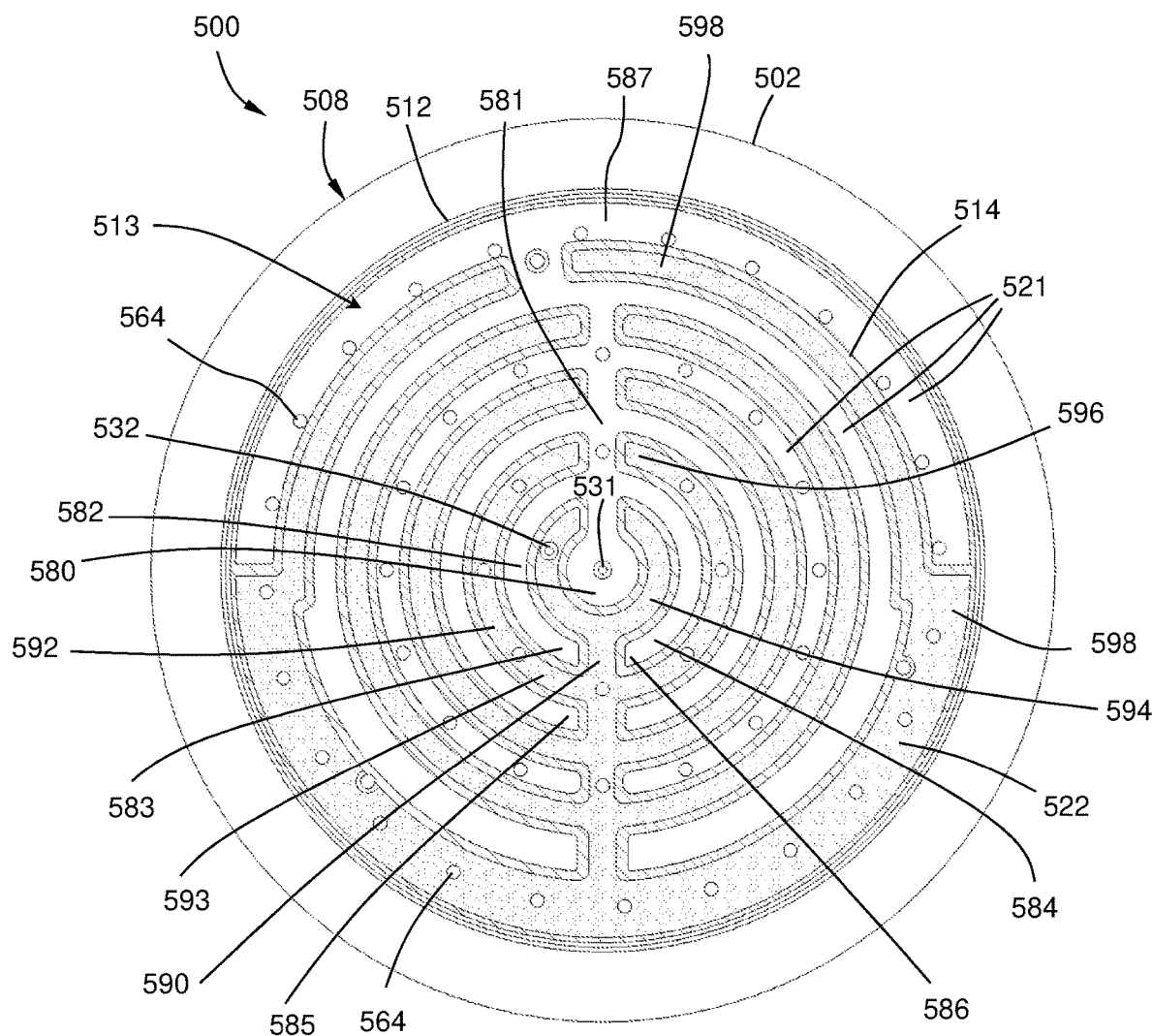

FIGS. 6 through 8 illustrate a substrate support 500 in accordance with one or more embodiments of the disclosure. FIG. 6 shows a cross-sectional view of a substrate support 500 or pedestal in a single-wafer configuration. However, the skilled artisan will recognize that the pedestal illustrated in FIG. 6 is equivalent to the pedestals (the standoffs 234 and heater 230) shown in FIGS. 1 through 5. FIGS. 7 and 8 illustrate schematic top views of a portion of a substrate support 500 similar to the one illustrated in FIG. 6 along line 7-7' showing internal components. The embodiments illustrated in FIGS. 6 through 8 are merely representative of possible configurations and should not be taken as limiting the scope of the disclosure.

The substrate supports 500 have a body 502 with a support surface 504 and a bottom surface 506. The distance between the support surface 504 and bottom surface 506 define the thickness T of the body 502. In some embodiments, as shown in FIG. 6, the support surface 504 is recessed within a pocket 503 formed in the body 502. In some embodiments, the pocket 503 has a depth measured from the outer peripheral edge 509 of the substrate support 500 that is substantially the same as the thickness of a substrate to be processed. The term "substantially the same" means that the depth of the pocket 503 is within 95% to 105% of the thickness of the substrate. The substrate support 500 of some embodiments has a round profile with an outer peripheral face 508. The skilled artisan will recognize that the body 502 and support surface 504 are equivalent to the heater 230 and support surface 231, respectively, shown in FIGS. 1-5.

The support surface 504 has a plurality of purge channels 510 extending a distance or depth D into the body 502. In some embodiments, the depth D that the purge channels 510 extend into the body 502 is in the range of 0.01 mm to 5 mm, or in the range of 0.5 to 4 mm, or in the range of 1 to 3 mm. The regions (not numbered) between the purge channels 510 are also referred to as mesas and in some embodiments supports the wafer during processing.

The field of purge channels 510 is bounded around an outer edge (relative to a rotational axis 501) by a seal band 512. The substrate sits on the seal band 512 so that the back side of the substrate seals against the seal band 512. In some embodiments, the seal band 512 is a generally circular shape (which can be solid or broken) with an inner diameter slightly smaller than the diameter of a substrate to be processed. For example, the seal band 512 for a 300 mm substrate in some embodiments has an inner diameter less than 299 mm. In some embodiments, the seal band 512 has a top surface substantially even with the support surfaces 504.

In some embodiments, the substrate support 500 is an electrostatic chuck, as illustrated schematically in FIGS. 6 through 8. In some embodiments, the body 502 includes a first electrode 521 and a second electrode 522 configured to electrostatically chuck a substrate to the support surface 504. The first electrode 521 and second electrode 522 can be made of any suitable conductive material known to the skilled artisan. The cross-sectional view of FIG. 6 shows a single first electrode 521 and single second electrode 522 that appear split due to the cross-section angle. FIGS. 7 and 8 show a top down view of a similar configuration in which the two electrodes are visible. In some embodiments, there are more than two electrodes spaced throughout the body to provide multiple zones of electrostatic chucking force. For example, in some embodiments, the first electrode is split into an inner zone and an outer zone and the second electrode is a single electrode throughout. This arrangement allows for zonal control of the chucking force and electrical potential differential by using separate power supplies, or separate voltage sources of a single power supply.

The first electrode 521 and the second electrode 522 are separated by a gap 514. In some embodiments, the gap 514 comprises a dielectric material. In some embodiments, the dielectric material of the gap 514 is the same material as the body 502. In some embodiments, the dielectric material comprises aluminum oxide ($Al_2O_3$, also referred to as AlO) or aluminum nitride (AlN). The gap 514 prevents electrical shorting between the first electrode 521 and the second electrode 522. In some embodiments, the gap 514 is configured to allow plasma generation adjacent the support surface 504. For example, the first electrode 521 and the second electrode 522 of some embodiments generates a plasma immediately adjacent the support surface 504 when a backflow gas is present. In some embodiments, the plasma generated has sufficient energy to clean the support surface 504 without the use of ancillary cleaning systems.

Figure 9:
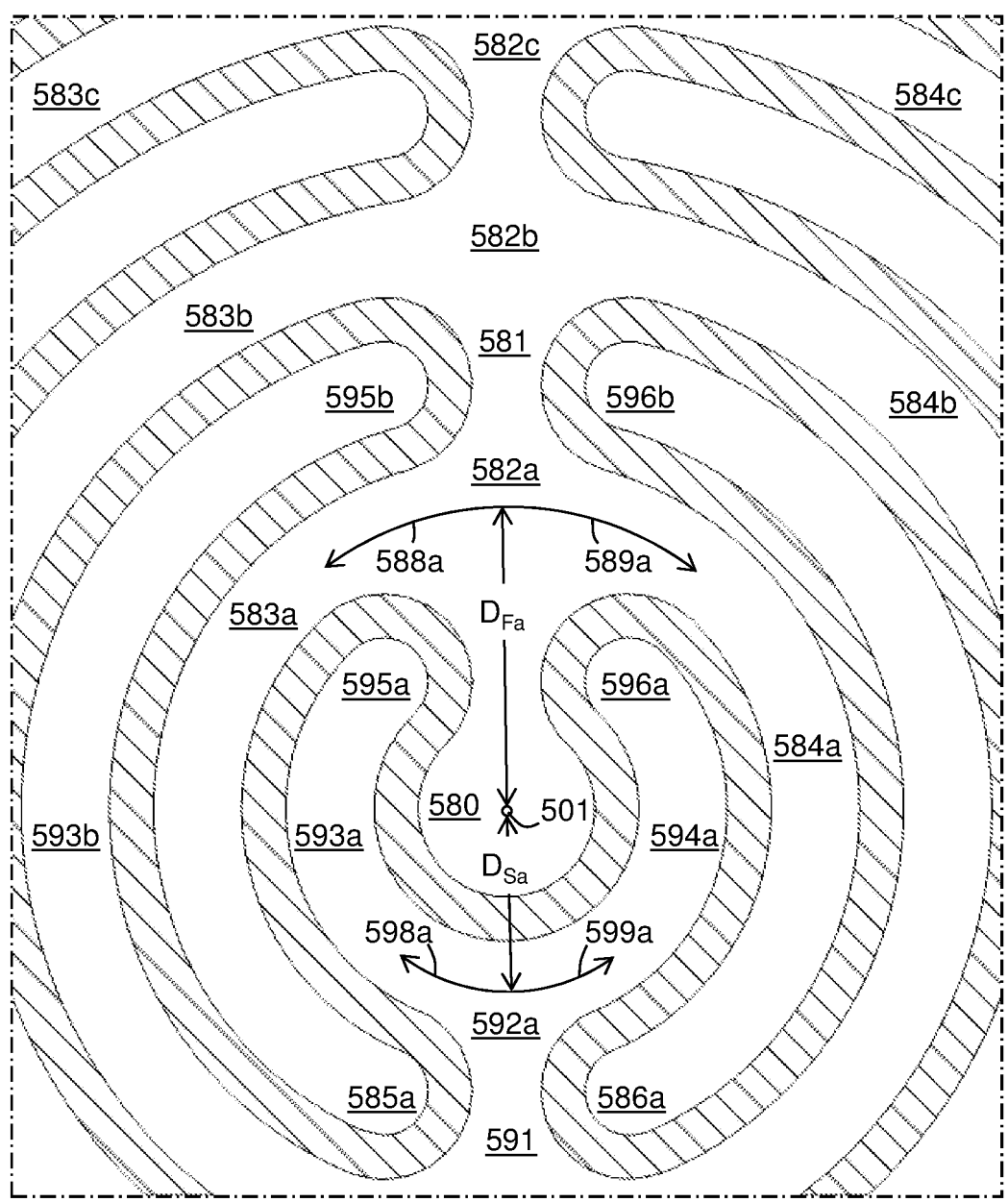
FIG. 9 is an expanded view of region 9 of FIG. 7.

FIGS. 7 and 8 illustrated different embodiments of the electrostatic chuck using the first electrode 521 and second electrode 522, as viewed along line 7-7' of FIG. 6. FIG. 9 illustrates an expanded view of a region 9 of the electrostatic chuck shown in FIG. 7. In some embodiments, the first electrode 521 is interdigitated with the second electrode 522 in a finger-joint like pattern. The shape of the electrodes can be any suitable shape and is not limited to the finger-joint like pattern shown in FIGS. 7 and 8.

The first electrode 521 has a middle hub 580 with a first trunk 581 extending in a first direction from the middle hub 580 to a first outer peripheral end 513. The second electrode 522 has a second trunk 591 and extends from an inner end 590 adjacent to and spaced from the middle hub 580 of the first electrode 521 to a second outer peripheral end 597. The second trunk 591 of the second electrode 522 extends in a second direction which is opposite the first direction of the first trunk 581 of the first electrode 521.

The first electrode 521 further comprises a plurality of first branches 582 crossing the first trunk 581 of the first electrode 521. FIG. 9 illustrates first branches 582a, 582b and 582c. Each of the plurality of first branches 582 are located a respective first trunk distance $D_F$ from the center of the middle hub 580 and each of the plurality of first branches 582 are spaced from adjacent first branches 582. FIG. 9 shows the respective first trunk distance $D_{Fa}$ measured from the rotational axis 501 at the center of the middle hub 580 to the middle of the innermost first branch 582a. For clarity of the drawings and understanding, the distances to each of the other first branches is not specifically labeled but the skilled artisan will understand that respective first trunk distance $D_{Fb}$ is the distance from the rotational axis 501 at the center of the middle hub 580 to the middle of the second branch 582b which is on the opposite side of the first branch 582a, etc. Stated differently, the inner edge of each of the first branches 582 is spaced from the outer edge of the first branch 582 closer to the middle hub 580, or spaced from the outer edge of the middle hub 580.

Each of the plurality of first branches 582 further comprises a first leg 583 extending from a trunk end at the first trunk 581 in a first direction and a second leg 584 extending from the first trunk 581 in a second direction. Each of the first legs 583 extends to a first branch end 585 in an arcuate path in a first azimuthal direction around the middle hub 580 with a respective first leg first radius equal to the first respective trunk distance and a second leg 584 extending from the first trunk 581 to a second branch end 586 in an arcuate path in a second azimuthal direction opposite the first azimuthal direction around the middle hub 580 with a respective second leg first radius equal to the first respective trunk distance. FIG. 9 illustrates an expanded view of a portion of the electrostatic chuck showing the innermost first branch 582a having an innermost first leg 583a extending in a first direction 588a and an innermost second leg 584a extending in a second direction 589a.

In some embodiments, the first branch end 585 is positioned a distance from the second trunk 591 of the second electrode 522. In some embodiments, the second branch end 586 is positioned a distance from the second trunk 591 of the second electrode 522. The distance of the first branch and 585 and second branch end 586 to the second trunk 591 is equal to the gap 514. Again, referring to FIG. 9 for an expanded view, the innermost first branch 582a has an innermost first leg 583a extending in a first direction 588a around the rotational axis 501 in the center of the middle hub 580 to an innermost first branch end 585a, and an innermost second leg 584a extending in a second direction 589a around the rotational axis 501 in the center of the middle hub 580 to an innermost second branch end 586a.

The second electrode 522 comprises a plurality of second branches 592 crossing the second trunk 591. FIG. 9 illustrates innermost second branch 592a. Each of the plurality of second branches are located a respective second trunk distance $D_S$ from the center of the middle hub 580 of the first electrode 521 and are spaced from adjacent second branches 592. FIG. 9 shows the respective second trunk distance $D_{Sa}$ measured from the rotational axis 501 at the center of the middle hub 580 to the middle of the innermost second branch 592a. For clarity of understanding, the distances to each of the other second branches is not specifically labeled but the skilled artisan will understand that a respective second trunk distance $D_{Sb}$ would be the distance from the rotational axis 501 at the center of the middle hub 580 to the middle of a second branch 592b, etc. Further, each of the plurality of second branches 592 have a first leg 593 extending from a trunk end at the second trunk 591 to a first branch end 595 in an arcuate path in a first radial direction around the middle hub 580 of the first electrode 521 with a respective first leg second radius equal to the respective second trunk distance and a second leg 594 extending from the second trunk 591 to a second branch end 596 in an arcuate path in a second radial direction opposite the first radial direction around the middle hub 580 of the first electrode 521 with a respective second leg second radius equal to the respective second trunk distance. As shown, in some embodiments, the first branch end 685 is positioned a distance from the first trunk 581 of the second electrode 522.

The first branches 582 are interdigitated and spaced from the second branches 592 by the gap 514. In some embodiments, the first branches 582 and second branches 592 are spaced a gap 514 sufficient to ignite a plasma immediately adjacent the support surface 504.

In some embodiments, the first branch end 585 of the first leg 583 of the plurality of first branches 582 and the second branch end 586 of the second leg 584 of the plurality of first branches 582 extend to and are separated from the second trunk 591 by the gap 514. Likewise, the first branch end 595 of the first leg 593 of the plurality of second branches 592 and the second branch end 596 of the second leg 594 of the plurality of second branches 592 extend to and are separated from the first trunk 581 by the gap 514.

In some embodiments, referring to FIG. 9, an innermost branch 592*a* of the plurality of second branches 592 extend at least partially around the middle hub 580 of the first electrode 521. The innermost branch 592*a* of the plurality of second branches 592 and the middle hub of the first electrode 521 are separated by the gap 514. The innermost branch 592*a* of the plurality of second branches 592 has a first leg 593*a* extending in a first direction 598*a* around the rotational axis 501 at the center of the middle hub 580 to an innermost first branch end 595*a*, and a second leg 594*a* extending in a second direction 599*a* around the rotational axis 501 at the center of the middle hub 580 to an innermost second branch end 596*a*.

In some embodiments, as shown in FIG. 7, an outermost branch 587 of the plurality of first branches 582 form an outermost ring 587*a* surrounding an outermost branch 598 of the plurality of second branches 592. In some embodiments, as shown in FIG. 7, the outermost ring 587*a* is a complete ring, meaning that the outermost ring 587*a* extends 360° around the rotational axis 501. In some embodiments, the second trunk 591 extends to the outermost ring 587*a* of the plurality of first branches 582. The second trunk 591 and the outermost ring 587*a* of the plurality of first branches 582 are separated by the gap 514.

As shown in FIG. 7, in some embodiments, the surface area of the outermost ring 587*a* of the plurality of first branches 582 and a surface area of the outermost branch 598 of the plurality of second branches 592 are the same. In some embodiments, the width of the outermost branch 587 of the plurality of first branches 582 is less than the width of the outermost branch 598 of the plurality of second branches 592.

As shown in FIG. 8, in some embodiments, the outermost branch 587 of the plurality of first branches 582 varies in width. In some embodiments, the outermost branch 598 of the plurality of second branches 592 varies in width. In some embodiments, the first leg 583 and the second leg 584 of the outermost branch 587 of the first plurality of first branches 582 are separated from the first leg 593 and the second leg 594 of the outermost branch 598 of the plurality of second branches 592 by the gap 514.

As shown in FIGS. 7-9, in some embodiments, each of the first leg 583 and the second leg 584 of each of the plurality of first branches 582 extend about 180 degrees from the first trunk 581 to each of the corresponding branch ends 585 and 586 of the plurality of first branches 582. Similarly, each of the first leg 593 and the second leg 594 of each of the plurality of second branches 582 extend about 180 degrees from the second trunk 591 to each of the corresponding branch ends 595 and 596 of the plurality of second branches 592. In some embodiments, each leg 583, 584, 593, 594 extends about 180° minus the angle associated with half the width of the trunk 581, 591 plus the width of the gap 514.

Referring to FIG. 8, in some embodiments, the first trunk 581 shifts a number of degrees in an azimuthal direction along the length of the trunk. In the embodiment shown in FIG. 8, the first trunk 581 shifts about 10° anticlockwise at the outermost branch 587 of the plurality of first branches 582. In some embodiments, the first trunk 581 shifts by a number of degrees in a first azimuthal direction at one or more of the plurality of first branches 582.

Figure 10:
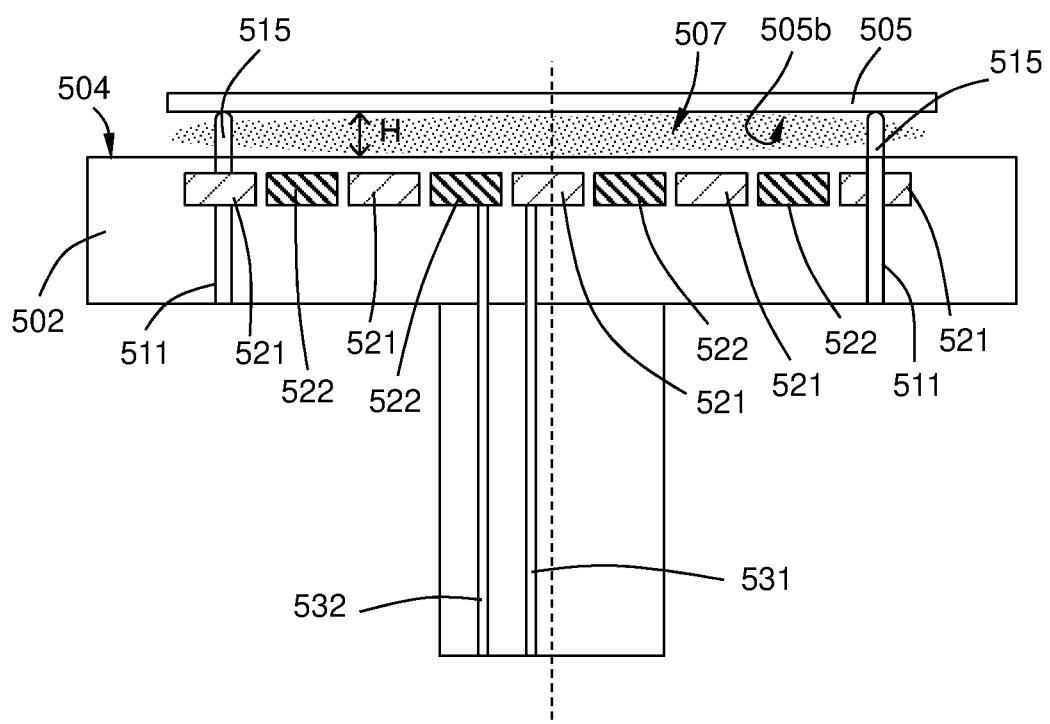
FIG. 10 is a partial cross-sectional schematic view of a method according to one or more embodiment of the disclosure.

Referring to FIG. 10, some embodiments of the disclosure are directed to methods of cleaning a support surface 504 of a substrate support and/or methods of cleaning/treating a backside of a substrate 505. In some embodiments, cleaning of the support surface 504 can occur when a substrate 505 is still positioned over the support surface 504 by lifting the substrate 505 a height H over the support surface 504 prior to generating a plasma 507. In some embodiments, the substrate 505 lifted from the support surface 504 using lift pins 515. The distance which the substrate is elevated is sufficient to clean the support surface 504 without the plasma damaging the bottom surface 505*b* of the substrate.

Lifting the substrate 505 from the support surface 504 is effectuated by a plurality of lift pins 515 that pass through lift pin openings 511 in the support surface 504. The plurality of lift pin openings 511 are configured to allow the plurality of lift pins to pass through each of the plurality of lift pin openings 511. In some embodiments, each of the lift pin openings 511 is within the plurality of first branches 582. In some embodiments, each of the lift pin openings 511 is within the plurality of second branches 592. In some embodiments, each of the lift pin openings 511 independently pass through one or more of the first electrode 521, second electrode 522 or dielectric in the gap 514.

Referring back to FIG. 6, some embodiments include a power supply 530 connected to the first electrode 521 and second electrode 522 to generate the voltage differential between the electrodes 521, 522. The power supply 530 connects through transmission lines 531, 532 to the electrodes 521, 522. The transmission lines 531, 532 are electrically separated by any suitable insulator to prevent shorting or arcing. In some embodiments, transmission lines 531, 532 are part of a coaxial cable. In some embodiments, transmission lines 531, 532 are separate lines.

The power supply 530 of some embodiments provides a first voltage (also referred to as potential) to the first electrode 521 and a second voltage to the second electrode 522 that is different from the first voltage. In some embodiments, the power supply 530 is configured to provide high voltage direct current (DC) and a low voltage alternating current (AC) component to the electrodes 521, 522.

In some embodiments, the body 502 further comprises at least one heating element 540 within the thickness T of the body 502. The at least one heating element 540 of some embodiments is connected to a power supply 530 through wires 533*a*, 533*b*. In some embodiments, the power supply for the at least one heating element 540 is a different power supply 530 than connected to the first electrode 521 and second electrode 522. The embodiment illustrated in FIG. 6 shows three heating element zones 540*a*, 540*b*, 540*c* spaced at different radii and at different positions along the rotational axis 501. The embodiment shows an outer zone 540*a* and an inner zone 540*c* on a first level in the body 502, and a center zone 540*b* on a second level in the body 502 closer to the support surface 504. The skilled artisan will recognize that the number and positioning of heating elements in the illustrated embodiment is merely one possible configuration and should not be taken as limiting the scope of the disclosure.

The substrate support 500 includes a support post 550 (equivalent to standoff 234) connected to the bottom surface 506 of the body 502. The support post 550 of some embodiments is hollow to contain the transmission lines 531, 532 and any other connections or conduits (e.g., a purge gas conduit or plenum). In some embodiments, the support post 550 is a generally solid body with openings to house the transmission lines 531, 532 and any other connections or conduits.

The embodiment illustrated in FIG. 6 includes a purge line 562 in fluid communication with the purge channels 510 formed in the support surface 504. The purge line 562 of some embodiments is connected to a purge gas source 560 to allow a purge gas to flow from the purge gas source 560 to the purge channels 510 through the purge line 562. In some embodiments, the support post 550 includes a plenum or cavity along the length of the purge line 562. In some embodiments, as illustrated, the purge line 562 connects to a second leg 564 of the purge line 562 to split the flow of purge gas into the different openings 566 in the purge channels 510. In some embodiments, the purge line 562 provides a flow of purge gas to the backside of a substrate positioned on the support surface 504. This is also referred to as a backside purge. The embodiments illustrated in FIGS. 7 and 8 show a plurality of purge lines 562 or second legs 564 spaced throughout the electrostatic chuck.

Referring back to FIG. 6, some embodiments of the disclosure include a controller 490 connected to one or more of the power supply 530, gas line 562 (or a valve on the gas line 562), wires 533a, 533b or the electrodes 521, 522.

Additional embodiments of the disclosure are directed to methods of cleaning a support surface 504 of a substrate support 500. The method comprises: generating a plasma between the first electrode 521 and the second electrode 522 over the gap 514 formed between the first electrode 521 and the second electrode 522 when a backflow gas is present within the processing station 110. The plasma generated is sufficient to clean the support surface 504 without the use of ancillary cleaning systems. In some embodiments where a substrate is present within the processing station, the method comprises the steps of: lifting a plurality of lift pins through a plurality of lift pin openings 511 by a height; and generating plasma between the first electrode 521 and the second electrode 522 over the gap 514 formed between the first electrode 521 and the second electrode 522 when a backflow gas is present within the processing station 110. In some embodiments, the method further comprises the steps of: lowering the substrate onto the substrate support surface.

Figure 11:
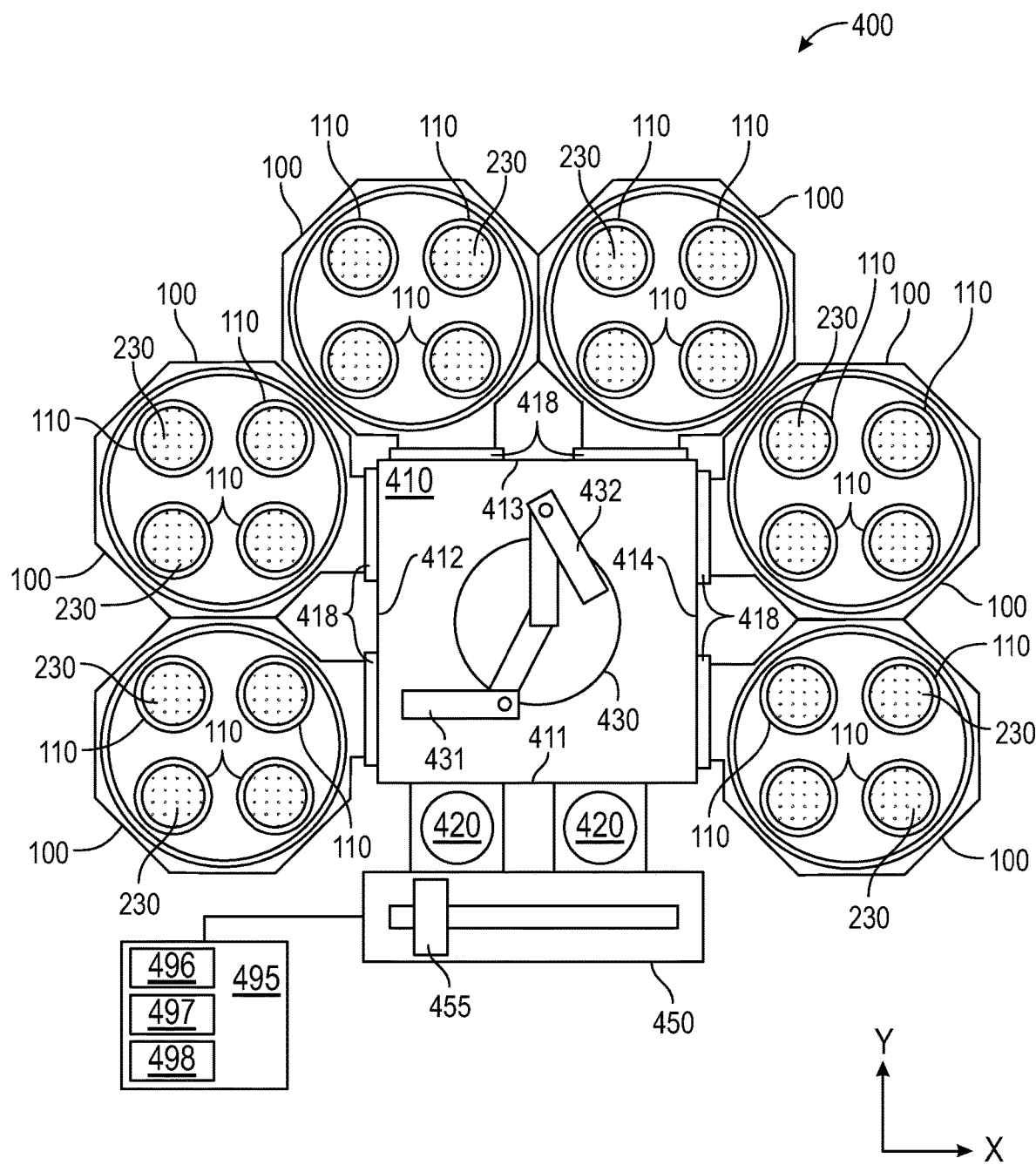
FIG. 11 is a schematic representation of a processing platform in accordance with one or more embodiment of the disclosure.

FIG. 11 shows a processing platform 400 in accordance with one or more embodiment of the disclosure. The embodiment shown in FIG. 11 is merely representative of one possible configuration and should not be taken as limiting the scope of the disclosure. For example, in some embodiments, the processing platform 400 has a different numbers of one or more of the processing chambers 100, buffer stations 420 and/or robot 430 configurations than the illustrated embodiment.

The exemplary processing platform 400 includes a central transfer station 410 which has a plurality of sides 411, 412, 413, 414. The transfer station 410 shown has a first side 411, a second side 412, a third side 413 and a fourth side 414. Although four sides are shown, those skilled in the art will understand that there can be any suitable number of sides to the transfer station 410 depending on, for example, the overall configuration of the processing platform 400. In some embodiments, there the transfer station 410 has three sides, four sides, five sides, six sides, seven sides or eight sides.

The transfer station 410 has a robot 430 positioned therein. The robot 430 can be any suitable robot capable of moving a substrate during processing. In some embodiments, the robot 430 has a first arm 431 and a second arm 432. The first arm 431 and second arm 432 can be moved independently of the other arm. The first arm 431 and second arm 432 can move in the x-y plane and/or along the z-axis. In some embodiments, the robot 430 includes a third arm (not shown) or a fourth arm (not shown). Each of the arms can move independently of other arms.

The embodiment illustrated includes six processing chambers 100 with two connected to each of the second side 412, third side 413 and fourth side 414 of the central transfer station 410. Each of the processing chambers 100 can be configured to perform different processes.

The processing platform 400 can also include one or more buffer station 420 connected to the first side 411 of the central transfer station 410. The buffer stations 420 can perform the same or different functions. For example, the buffer stations may hold a cassette of substrates which are processed and returned to the original cassette, or one of the buffer stations may hold unprocessed substrates which are moved to the other buffer station after processing. In some embodiments, one or more of the buffer stations are configured to pre-treat, pre-heat or clean the substrates before and/or after processing.

The processing platform 400 may also include one or more slit valves 418 between the central transfer station 410 and any of the processing chambers 100. The slit valves 418 can open and close to isolate the interior volume within the processing chamber 100 from the environment within the central transfer station 410. For example, if the processing chamber will generate plasma during processing, it may be helpful to close the slit valve for that processing chamber to prevent stray plasma from damaging the robot in the transfer station.

The processing platform 400 can be connected to a factory interface 450 to allow substrates or cassettes of substrates to be loaded into the processing platform 400. A robot 455 within the factory interface 450 can be used to move the substrates or cassettes into and out of the buffer stations. The substrates or cassettes can be moved within the processing platform 400 by the robot 430 in the central transfer station 410. In some embodiments, the factory interface 450 is a transfer station of another cluster tool (i.e., another multiple chamber processing platform).

A controller 495 may be provided and coupled to various components of the processing platform 400 to control the operation thereof. The controller 495 can be a single controller that controls the entire processing platform 400, or multiple controllers that control individual portions of the processing platform 400. For example, the processing platform 400 of some embodiments comprises separate controllers for one or more of the individual processing chambers 100, central transfer station 410, factory interface 450 and/or robots 430.

In some embodiments, the processing chamber 100 further comprises a controller 495 connected to the plurality of substantially coplanar support surfaces 231 configured to control one or more of the first temperature or the second temperature. In one or more embodiments, the controller 495 controls a movement speed of the support assembly 200 (see FIG. 2).

In some embodiments, the controller 495 includes a central processing unit (CPU) 496, a memory 497, and support circuits 498. The controller 495 may control the processing platform 400 directly, or via computers (or controllers) associated with particular process chamber and/or support system components.

The controller 495 may be one of any form of general-purpose computer processor that can be used in an industrial setting for controlling various chambers and sub-processors. The memory 497 or computer readable medium of the controller 495 may be one or more of readily available memory such as random access memory (RAM), read only memory (ROM), floppy disk, hard disk, optical storage media (e.g., compact disc or digital video disc), flash drive, or any other form of digital storage, local or remote. The memory 497 can retain an instruction set that is operable by the processor (CPU 496) to control parameters and components of the processing platform 400.

The support circuits 498 are coupled to the CPU 496 for supporting the processor in a conventional manner. These circuits include cache, power supplies, clock circuits, input/output circuitry and subsystems, and the like. One or more processes may be stored in the memory 498 as software routine that, when executed or invoked by the processor, causes the processor to control the operation of the processing platform 400 or individual processing chambers in the manner described herein. The software routine may also be stored and/or executed by a second CPU (not shown) that is remotely located from the hardware being controlled by the CPU 496.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 495 has one or more configurations to execute individual processes or sub-processes to perform the method. The controller 495 can be connected to and configured to operate intermediate components to perform the functions of the methods. For example, the controller 495 can be connected to and configured to control one or more of gas valves, actuators, motors, slit valves, vacuum control or other components.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A substrate support having an electrostatic chuck, the substrate support comprising:
    a first electrode having a middle hub with a first trunk extending in a first direction from the middle hub to a first outer peripheral end;
    a second electrode with a second trunk extending in a second direction opposite the first direction from an inner end adjacent to and spaced from the middle hub to a second outer peripheral end;
    a plurality of first branches crossing the first trunk, each of the first branches located a respective first trunk distance from the middle hub and spaced from adjacent first branches, each of the first branches having a first leg extending from a trunk end at the first trunk to a branch end in an arcuate path in a first direction around the middle hub with a respective first leg first radius equal to the respective first trunk distance, and a second leg extending from a trunk end at the first trunk to a branch end in an arcuate path in a second direction opposite the first direction around the middle hub with a respective second leg first radius equal to the respective first trunk distance;
    a plurality of second branches crossing the second trunk, each of the second branches located a respective second trunk distance from the middle hub and spaced from adjacent second branches, each of the second branches having a first leg extending from a trunk end at the second trunk to a branch end in an arcuate path in a first direction around the middle hub with a respective first leg second radius equal to the respective second trunk distance and a second leg extending from a trunk end at the second trunk to a branch end in an arcuate path in a second direction around the middle hub with a respective second leg second radius equal to the respective second trunk distance, the plurality of second branches inter-digitated with and spaced from the plurality of first branches by a gap; and
    a power supply connected to the first and second electrodes configured to provide direct current (DC) and alternating current (AC),
    wherein the gap is configured to ignite a plasma immediately adjacent a support surface.

2. The substrate support of claim 1, wherein each of the branch ends of the first legs of the plurality of first branches, and each of the branch ends of the second legs of the plurality of first branches extend to and are separated from the second trunk by a gap.

3. The substrate support of claim 1, wherein each of the branch ends of the first legs of the plurality of second branches, and each of the branch ends of the second legs of the plurality of second branches extend to and are separated from the first trunk by a gap.

4. The substrate support of claim 1, wherein an innermost branch of the plurality of second branches extends around the middle hub of the first electrode.

5. The substrate support of claim 4, wherein the innermost branch of the plurality of the plurality of second branches and the middle hub of the first electrode are separated by a gap.

6. The substrate support of claim 1, wherein an outermost branch of the first plurality of branches forms a complete ring around an outermost branch of the second plurality of branches.

7. The substrate support of claim 6, wherein the second trunk extends to the complete ring of the outermost branch of the first plurality of branches.

8. The substrate support of claim 6, wherein a surface area of the outermost ring of the first plurality of branches and a surface area of an outermost branch of the second plurality of branches are the same.

9. The substrate support of claim 6, wherein the outermost branch of the first plurality of branches varies in width.

10. The substrate support of claim 6, wherein the outermost branch of the second plurality of branches varies in width.

11. The substrate support of claim 1 further comprising a plurality of lift pin openings configured to allow a lift pin to pass through.

12. The substrate support of claim 11, wherein the lift pins are configured to elevate a substrate over the substrate support by a height sufficient to generate plasma without damaging a bottom surface of the substrate.

13. The substrate support of claim 11, wherein each of the lift pin openings are within the plurality of first branches.

14. The substrate support of claim 11, wherein each of the lift pin openings are within the plurality of second branches.

15. The substrate support of claim 1 further comprising a plurality of gas openings to allow for a flow of gas to pass through a substrate support surface of the substrate support out of the support surface.

16. The substrate support of claim 1, wherein the first trunk shifts a number of degrees in a first direction at an outermost branch of the plurality of first branches.

17. The substrate support of claim 1, wherein each of the first and second legs of each of the plurality of first branches extend about 180 degrees from the first trunk to each of the corresponding branch ends, and each of the first and second legs of each of the plurality of second branches extend about 180 degrees from the second trunk to each of the corresponding the branch ends.

* * * * *